(12) United States Patent
Butcher

(10) Patent No.: US 6,661,862 B1
(45) Date of Patent: Dec. 9, 2003

(54) DIGITAL DELAY LINE-BASED PHASE DETECTOR

(75) Inventor: James S. Butcher, Phoenix, AZ (US)

(73) Assignee: Adtran, Inc., Huntsville, AL (US)

( * ) Notice: Subject to any disclaimer, the term of this patent is extended or adjusted under 35 U.S.C. 154(b) by 0 days.

(21) Appl. No.: 09/579,884

(22) Filed: May 26, 2000

(65) Prior Publication Data

(65)

(51) Int. Cl.$^7$ .................................................. H04D 3/24
(52) U.S. Cl. ........................ 375/375; 375/371; 375/373
(58) Field of Search ......................... 375/361, 331, 375/360, 220, 328, 376, 333, 375; 327/184, 150

(56) References Cited

U.S. PATENT DOCUMENTS

| | | | | |
|---|---|---|---|---|
| 5,103,466 A | * | 4/1992 | Bazes ......................... | 375/361 |
| 5,367,538 A | | 11/1994 | LaRosa et al. ................. | 375/82 |
| 5,668,830 A | | 9/1997 | Georgiou et al. ........... | 375/220 |
| 5,757,868 A | | 5/1998 | Kelton et al. ............... | 726/727 |
| 5,841,816 A | | 11/1998 | Dent et al. ................... | 375/331 |
| 5,883,536 A | | 3/1999 | Patterson .................... | 327/184 |

\* cited by examiner

*Primary Examiner*—Stephen Chin
*Assistant Examiner*—Curtis Odom
(74) *Attorney, Agent, or Firm*—Allen, Dyer, Doppelt, Milbrath & Gilchrist, P.A.

(57) ABSTRACT

A digital delay line-based, timing relationship detector is operative to generate a K+L bit digital output code representative of a timing/phase offset between first and second low frequency clock signals. A first digital code generator generates a K-bit most significant phase word based upon the number of high frequency clock signals counted between transitions in the two low frequency clock signals. A second digital code generator generates an L-bit least significant phase word based upon the effective length of a delay line/shift register, through which a digital value associated with a transition in one of the two clock signals propagates, until a transition of the next occurring high frequency clock signal. The contents of a counter are incrementally changed in accordance with the number of stages of the multistage digital delay line/shift register through which the digital value has propagated. The L-bit least significant phase word is defined in accordance with the contents of the counter.

20 Claims, 6 Drawing Sheets

DIGITAL DELAY LINE-BASED PHASE DETECTOR

FIELD OF THE INVENTION

The present invention relates in general to communication systems and subsystems therefor, is particularly directed to a digital delay line-based phase detector, which is operative to generate a digital output code that is representative, to a very high resolution in increments of the delay of a digital gate (e.g., nanoseconds), of the timing relationship (e.g., phase difference) between two signals, such as relatively lower frequency local clock and reference clock signals.

BACKGROUND OF THE INVENTION

A common requirement of communication systems, such as, but not limited to, digital telecommunication systems and networks, is the precision alignment (phase-locking) of a pair of (clock) signals, one of which may be derived or extracted from an external source, such as a received signal, and the other of which is locally generated, such as a reference oscillator of a phase locked loop (PLL). FIG. 1 diagrammatically illustrates a reduced complexity prior art phase difference architecture employed for controlling the output frequency of a phase locked loop-based clock recovery circuit.

This prior art circuit incorporates an exclusive-OR circuit-based phase detector 10, the output of which is coupled to an analog low pass filter 12 to derive an analog value representative of the phase difference between two clock signals applied to the phase detector 10. This analog phase difference value is quantized by an analog-to-digital converter (ADC) 14 to provide a digital phase word. The digital phase word is then coupled to a digital filter 16, which performs a low pass filtering function and applies its output to a digital-to-analog converter (DAC) 18. The output of the DAC 18 is used to control the output frequency produced by a voltage controlled oscillator (VCO) 19.

A fundamental shortcoming of this type of circuit is the fact that it uses an ADC to digitize analog phase information. In the first place, not only are precision ADCs costly, but analog components are subject to variations due to changes in temperature, aging, and the like. Also, it is difficult to achieve high phase resolution over a wide range of phase difference between the two clock signals.

Direct digital synthesis (DDS) techniques, which derive a variable frequency, phase-locked clock from a fixed frequency oscillator, offer a significant improvement over the conventional approach of FIG. 1, since a DDS scheme is able to provide a very high resolution clock phase from a relatively low cost fixed frequency oscillator; however, the resulting jitter must be filtered using a wide bandwidth analog phase-locked loop. In addition, a relatively high order analog anti-aliasing low pass filter is usually installed downstream of the DDS' DAC prior to a comparator, which samples the analog signal and outputs the digital clock.

For examples of patent documentation which illustrate various prior art schemes including those described above, attention may be directed to the U.S. Pat. Nos: 5,638,410; 5,084,669; 5,220,275; and 5,790,614.

SUMMARY OF THE INVENTION

In accordance with the present invention, shortcomings of conventional phase detection schemes are effectively obviated by a digital delay line-based timing relationship detector. This detector is configured to generate a digital code representative of the phase difference between two signals, as a combination of a first, most significant phase word (or MSPW), and a second, least significant phase word (or LSPW). The value of the MSPW is produced by a first code generator in accordance with the number of high frequency clock signals counted between transitions in a first (low frequency) local clock signal (termed an LF LOCAL CLOCK signal) and a second, low frequency reference clock signal (termed an LF REF CLOCK) to within one cycle of a prescribed high frequency (HF) clock signal. By high frequency clock signal is meant a clock signal whose frequency is considerably higher (e.g., several orders of magnitude or greater) than those of the low frequency local and reference signals whose phase differential is to be determined. The frequencies of the low frequency local and reference signals are typically approximately the same.

The LSPW is produced by a delay line phase sampler (DLPS), which functions as a second digital code generator.

The value of the LSPW is defined by the number of stages of a multistage digital delay line/shift register, through which a digital value associated with a transition in one of the two signals propagates until the next transition in the high frequency clock signal. At this transition, the location of the digital value is frozen in the delay line/shift register, and the delay line/shift register is configured to operate in shift register mode. As the contents of the shift register are sequentially clocked out, the contents of a counter are sequentially modified to realize the value of the LSPW.

The first digital code generator contains a K-bit phase down-counter, whose contents are decremented one count for each HF clock period, from a preloaded (high) count to a low count. A high count represents a +180° phase value, a mid count represents a 0° phase value, and a low count represents a −180° phase value. The most significant bit of the K-bit phase word within the down-counter represents the polarity of the phase. The low frequency local clock signal is generated in alignment with and as an integral multiple of (typically several orders of magnitude lower in frequency than) the HF clock. The sequentially decremented count value within the phase down-counter is controllably loaded into a K-bit MSPW latch of a digital code combiner. The contents of the K-bit latch are controllably transferred to an intermediate K+L bit phase word latch upstream of an output K+L bit phase word latch.

The most significant bit (MSB) of the mid count value of the K-bit count in the phase down-counter (as advanced by two HF clock periods) is used to produce the LF LOCAL CLOCK signal. The DLPS compares the LF REF CLOCK signal and the HF clock signal, in order to provide a very precise measure(in terms of a fraction of an HF clock cycle) of the relative timing differential between the LF LOCAL CLOCK signal and the LF REF CLOCK signal. It then supplies a LATCH MSPW output pulse to the K-bit latch, which loads the contents of the K-bit phase down-counter as a K-bit MSPW.

Some number (one to $2^L$) of HF clocks subsequent to a prescribed transition (e.g., rising edge) of the LF REF CLOCK signal, the DLPS outputs a stable L-bit LSPW word representative of the relative timing differential between the rising edge of the LF REF CLOCK signal and the next rising edge of the HF clock signal. The DLPS then supplies a LATCH PW pulse to the intermediate K+L bit phase word latch, so that the K-bit MSPW from the K-bit latch and the LSPW word from the DLPS are loaded as a K+L bit phase word into the intermediate K+L bit latch. It also controls the transfer of the K+L bit phase word in the intermediate latch to an output latch. The K+L output bit phase word in the output latch is a binary representation of the phase position of the rising edge of the LF REF CLOCK signal with respect to the rising edge of the LF LOCAL CLOCK signal.

The DLPS includes a multistage digital delay line/shift register formed of a cascaded arrangement of flip-flops interleaved with selector gates. The overall length of the delay line/shift register provides an effective electronic propagation delay equal to or greater than the period of one HF clock signal. The delay line is coupled to the output of a multibit input shift register, to which the LF REF CLOCK signal is supplied. Front end stages of the delay line/shift register are coupled through an OR gate to produce a shift delay line signal SHIFT DL, which controls the selector gates, and is used to generate the LATCH MSPW pulse. The last stage of the delay line/shift register is used to generate END SHIFT and COUNT signals that are used to control the operation of an LSPW up-counter from which the L-bit LSPW is derived. The LATCH PW is delayed by the END SHIFT signal for controlling loading of the MSPW AND LSPW into the K+L intermediate latch.

When a transition (e.g., rising edge) of the LF REF CLOCK signal is sampled, a '1' bit propagates through the selector gates of successive stages of the delay line/shift register, which initially is controlled so as to operate as a delay line. Upon the rising edge of the next HF CLOCK signal, the shift register latches the effective propagation delay length. Upon the rising edge of the next HF clock signal, the operational state of the delay line/shift register converts to a shift register, so that its contents may be read out via the LSPW up-counter. The contents of the LSPW up-counter are then sequentially incremented by further HF CLOCK signals. Once the rightmost '1' bit is clocked into the last stage of the delay line/shift register, the logic state of the COUNT signal terminates incrementing the contents of LSPW up-counter, and further shifting of the delay line/shift register. The up-counter now contains a binary value representative of the fractional HF cycle phase delay. Through inverters this binary value is converted into the LSPW.

To ensure that under the conditions of fast propagation times, the number of selector gates is typically greater than that required to provide a single HF CLOCK period delay. This creates a nonlinear phase mapping of the LSPW with respect to the MSPW. There is a discontinuity in the rollover of the LSPW count to or from a zero count, as the MSPW is incremented or decremented by one count. However, the value of the phase word will always increase or decrease monotonically, as the LF REF CLOCK signal phase is advanced or retarded relative to the LF LOCAL CLOCK signal. In some phase-locked applications, monotonic phase mapping containing discontinuities is acceptable. However, for applications that require improved linearity, periodic calibration can be used to linearize the LSPW values. The LSPW linearizer conducts a periodic calibration to determine one HF CLOCK signal period delay LSPW unscaled count. This count, termed a CAL count, is used to scale or multiply by a scaling factor all LSPW values up to the full $2^{L-1}$ count range. The LSPW scaler performs the multiplication: LSPW scaled=$2^{L-1}$/CAL COUNT×LSPW UNSCALED.

Calibration is performed by substituting a calibration clock rising edge for a LF REF CLOCK signal rising edge to the DLPS at periodic intervals, with the interval to ensure insignificant delay drift due to integrated circuit temperature and supply voltage variations. During the calibration cycle, the previous value of the LSPW is output and the CAL count value is updated. If the digital, delay line-based, timing relationship detector of the invention is employed in an application where the phase of the LF REF CLOCK signal varies continuously by more than a single period of the HF CLOCK signal, it is only necessary to periodically detect the maximum value of the LSPW count and latch this maximum value as the CAL count. No calibration cycle, which results in a loss of one LSPW sample, is necessary.

DETAILED DESCRIPTION

Figure 1:
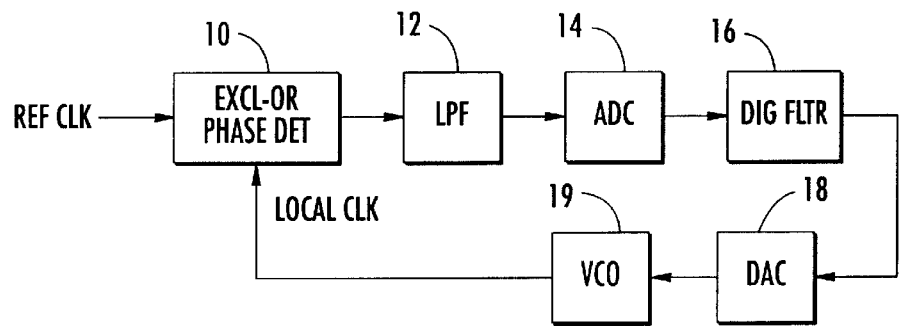
FIG. 1 diagrammatically illustrates a prior art phase difference architecture.

Before describing in detail the new and improved digital delay line-based timing relationship detector of the present invention, it should be observed that the invention resides primarily in prescribed modular arrangements of conventional digital circuits and components. In a practical implementation that facilitates their incorporation into existing printed circuit cards of telecommunication equipment and the like, these modular arrangements may be readily implemented in a field programmable gate array (FPGA), or application specific integrated circuit (ASIC) chip.

Consequently, the configuration of such arrangements of circuits and components and their operation have, for the most part, been illustrated in the drawings by readily understandable digital logic block diagrams and associated timing diagrams, which show only those specific details that are pertinent to the present invention, so as not to obscure the disclosure with details which will be readily apparent to those skilled in the art having the benefit of the description herein. Thus, the diagrammatic illustrations are primarily intended to show the major components of the invention and associated timing relationships in convenient functional groupings, whereby the present invention may be more readily understood.

Figure 2:
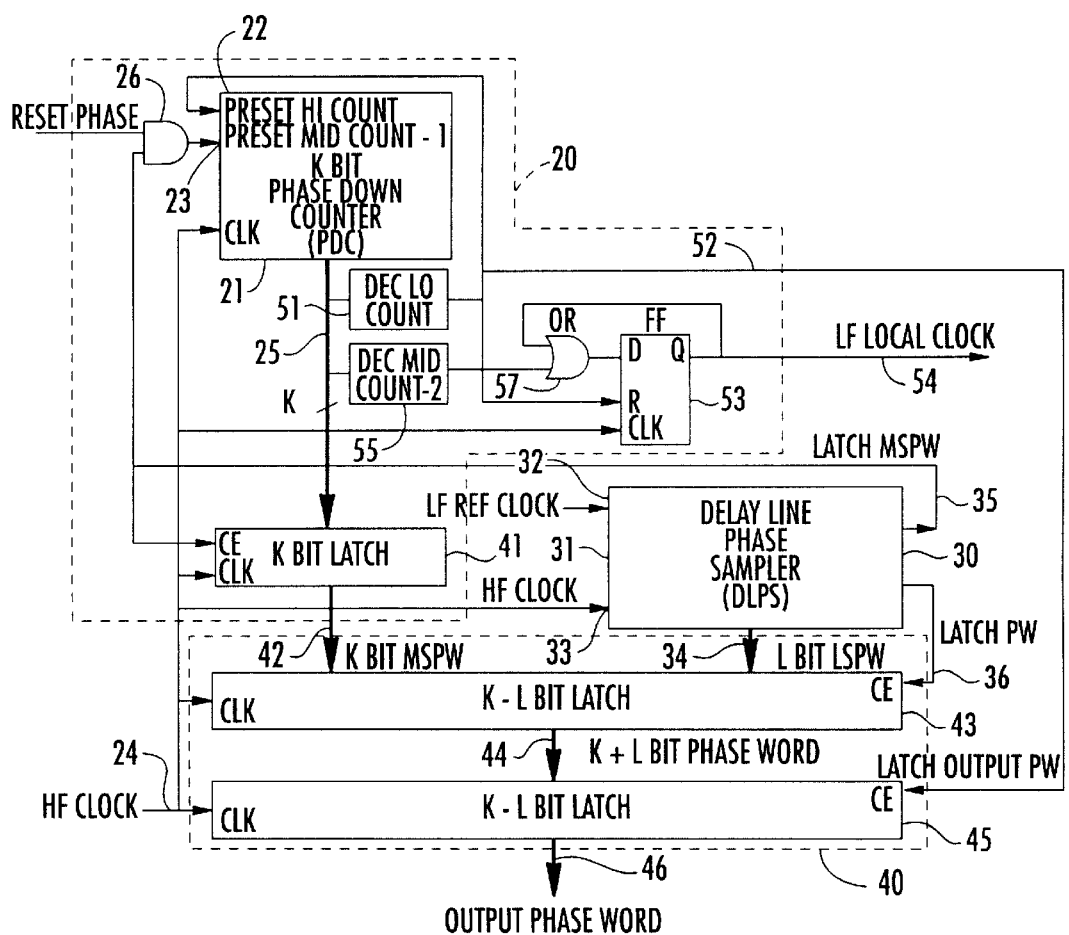
FIG. 2 diagrammatically illustrates the general configuration of a digital delay line-based timing relationship detector of the present invention.

The overall configuration of the digital delay line-based timing relationship detector of the present invention is shown diagrammatically in FIG. 2 as comprising a first digital code generator 20, a second digital code generator 30, and a digital code combiner 40. The first digital code generator 20 is operative to generate a first digital code (the most significant phase word (MSPW)), that is representative of the phase difference between a (low frequency) local clock signal (denoted LF LOCAL CLOCK) and a low frequency reference clock signal (denoted LF REF CLOCK) to within one cycle of a prescribed high frequency (HF) clock signal. The second digital code generator 30 is operative to generate a second digital code (the least significant phase word (LSPW)), that is representative of where, within one cycle of the HF clock signal, a transition in the LF LOCAL CLOCK signal occurs relative to a transition in the LF REF CLOCK.

The first digital code generator 20 is configured principally of a K-bit phase down-counter 21, that is preloadable by means of one of a preset high count input 22 and a preset mid count-1 input 23. The contents of the K-bit phase down-counter 21 are decremented by a high frequency (HF) clock signal supplied over a high frequency clock line 24, that is employed to clock and thereby synchronize the operation of various circuit components of the timing relationship detector of the invention. The contents of the K-bit phase down-counter 21 are decremented in a binary fashion, one count for each HF clock period, from a preloaded (high) count to a low count. The K-bit phase down-counter 21 is configured such that a high count (HI COUNT) represents a +180° phase value, a mid count (MID COUNT=10000 . . . 000) represents a 0° phase value, and a low count (LO COUNT) represents a −180° phase value. The most significant bit (MSB) of the K-bit phase word within the down-counter 21 represents the polarity of the phase. An MSB=1 corresponds to a (+) phase, while an MSB=0 corresponds to a (−) phase. Once it has reached its low count value, the K-bit phase down-counter 21 rolls over to the HI count value in receipt of the next HF clock signal.

A low frequency local clock signal (LF LOCAL CLOCK) is generated in alignment with and as an integral multiple of (typically several orders of magnitude lower in frequency than) the HF clock, by inverting the MSB of the mid count value, advanced by two HF clock periods, as detected by a DEC MID COUNT+2 circuit 55. The 0° phase position corresponds to the alignment of a prescribed transition in the low frequency reference clock signal (LF REF CLOCK signal) with a prescribed transition in the LF LOCAL CLOCK signal. As a non-limiting example, the prescribed transitions may correspond to rising edges thereof, as will be described.

The running (sequentially decremented by the HF clock) count value within the K-bit phase down-counter 21 is coupled over a multibit parallel link 25 to a K-bit MSPW latch 41. The K-bit latch 41 is clocked by the HF clock signal, and is controllably enabled by the application of a LATCH MSPW signal 35 to its chip enable (CE) input from a delay line phase sampler (DLPS) 31. When so enabled, the K-bit latch is loaded with the count value of the down-counter 21 as the K-bit most significant phase word (MSPW). The contents of K-bit latch 41 are coupled over K-bit output link 42 to a K-bit, most significant register of an intermediate K+L bit phase word latch 43 upstream of an output K+L bit phase word latch 45. The output K+L bit latch 45, which is clocked by the HF clock signal on line 24, ensures that output phase samples are produced at a fixed phase position relative to the LF LOCAL CLOCK signal 54. In an optional mode, where fixed phase position is unnecessary, the output latch 45 is not required. The output K+L bit phase word provides a binary representation of the phase position of the rising edge of the LF REF CLOCK signal 32 with respect to the rising edge of the LF LOCAL CLOCK signal 54, where the mid count value (10000 . . . 000) represents phase alignment at zero degrees phase, as described above.

The preset high count input 22 of the K-bit phase down-counter 21 is coupled to the output of a decrement low count circuit 51, which is also coupled to the link 25 from the K-bit phase down-counter 21. The preset mid count-1 input 23 of the down-counter 21 is coupled to the output of an AND gate 26. AND gate 26 has a first input coupled to receive a RESET PHASE signal, and a second input coupled to receive the LATCH MSPW signal 35 from the DLPS 31.

The output signal 52 of the decrement low counter circuit 51, which provides a LATCH OUTPUT PHASE WORD (PW) input to the CE port of the K+L bit output phase word latch 45, is further coupled to a reset input of a flip-flop 53. The DEC MID COUNT+2 circuit 55 input is coupled to the output link 25 from the K-bit phase down-counter 21, and has its output coupled through an OR gate 57 to a data (D) input of flip-flop 53. The Q output of flip-flop 53, from which the LF LOCAL CLOCK is derived on output lead 54, is fed back to its D input through the OR gate 57.

Figure 4:
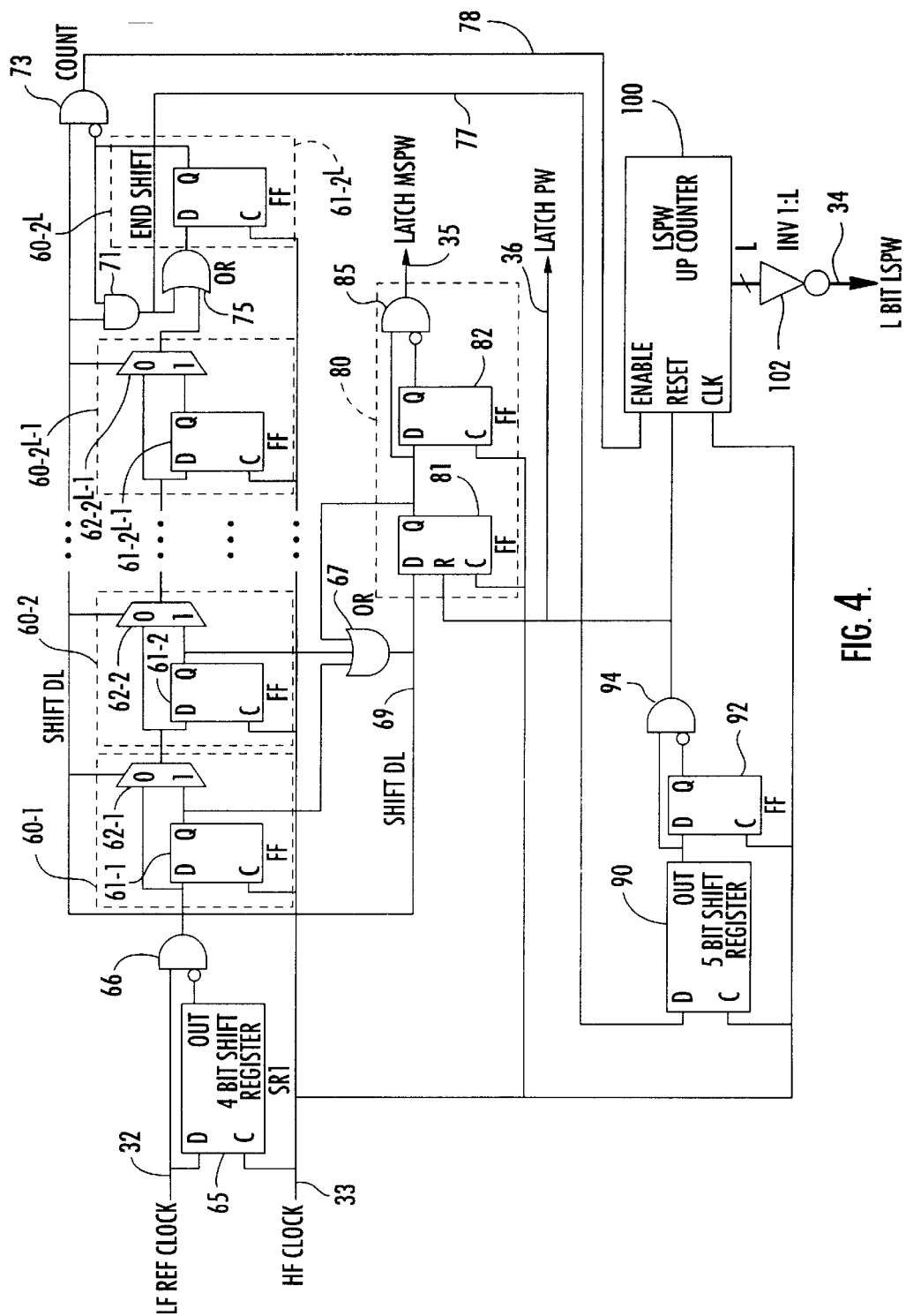
FIG. 4 shows the configuration of a delay line phase sampler (DLPS)

The DLPS 31 forms the principal operational component of the second digital code generator 30 and is shown in detail in FIG. 4, to be described. The LF REF CLOCK is coupled to a reference input 32 of the DLPS 31, a clock input 33 of which is coupled to receive the HF clock signal. In addition to generating the LATCH MSPW signal, the DLPS 31 is operative to couple a LATCH PW signal over line 36 to the CE input of the intermediate K+L bit phase word latch 43. As will be described in detail with reference to FIG. 4, the principal functionality of the DLPS 31 is implemented by means of a multistage digital delay line/shift register, which has an electronic propagation or overall delay line length that corresponds to the period of one HF clock signal.

This internal delay line within DLPS 31 is used to form a second, L-bit, digital code word, for the least significant phase word (LSPW), which is coupled over L-bit link 34 to an L-bit, least significant register within intermediate K+L bit phase word latch 43. As noted earlier, the value of the LSPW is defined by the number of stages of the multistage digital delay line, through which a digital value (e.g., a '1' bit) associated with a transition in the LF REF CLOCK signal, propagates until the next transition in the HF clock signal. The LSPW serves to provide a very precise indication, in terms of a fraction of a single HF clock cycle, of the relative timing differential between the LF LOCAL CLOCK signal and the LF REF CLOCK signal.

Figure 3:
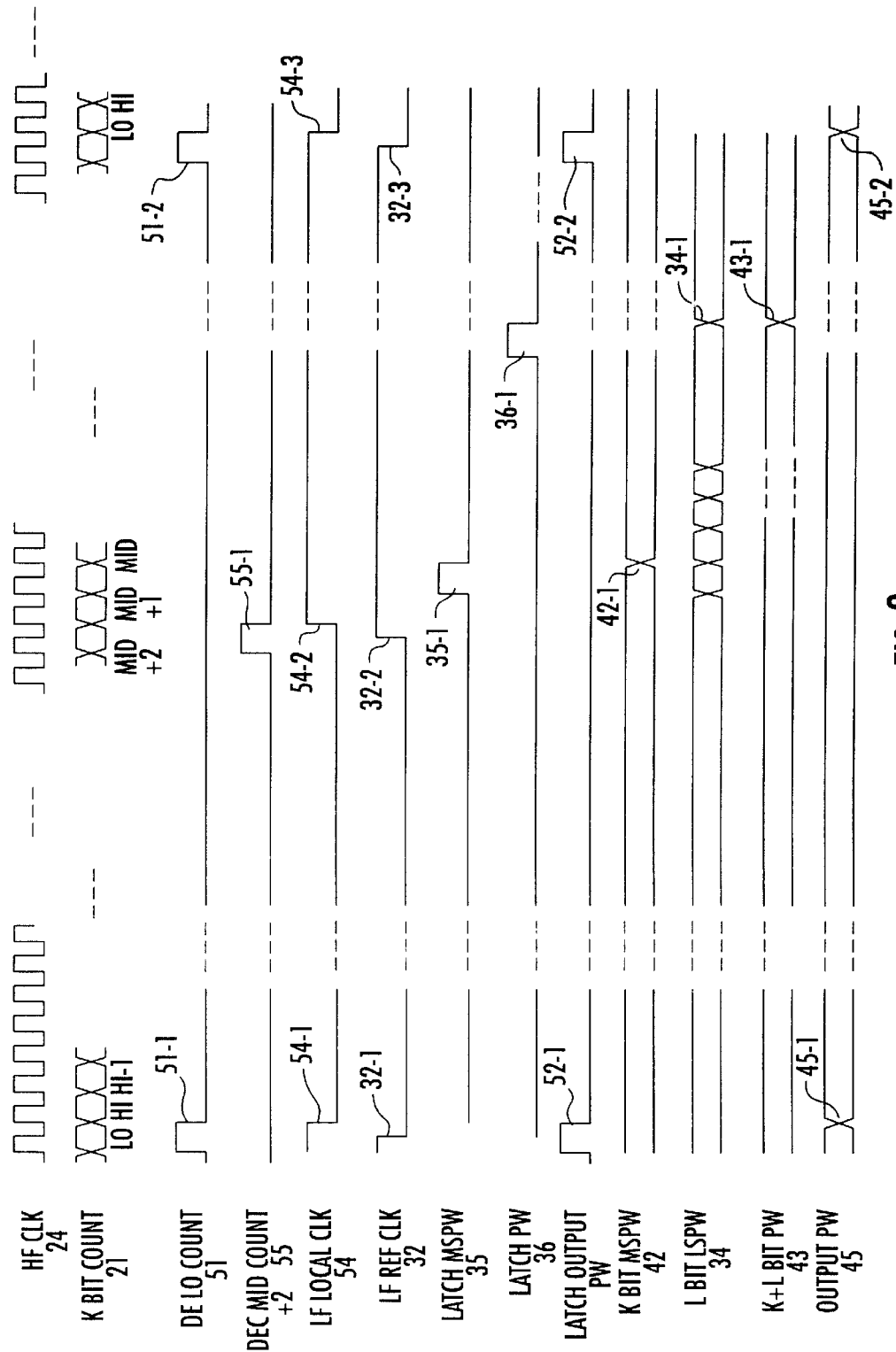
FIG. 3 is a timing diagram associated with the operation of the delay line-based timing relationship detector of FIG. 2

The general operation of the delay line-based timing relationship detector shown in FIG. 2 may be understood from the timing diagram of FIG. 3. In this and subsequently described timing diagrams of FIGS. 5, 6 and 8, a respective signal trace is labelled by a prefix corresponding to the reference numeral of its associated component in the block diagram, whose operation is being described, and a suffix corresponding to an individually identified portion of that signal trace.

For purposes of providing a non-limiting example, the timing diagram of FIG. 3 shows the case where the LF REF CLOCK signal slightly leads, or is advanced in phase relative to, the LF LOCAL CLOCK signal. Thus, respective edges 32-1, 32-2 and 32-3 of the LF REF CLOCK signal transition slightly ahead of edges 54-1, 54-2 and 54-3 of the LF LOCAL CLOCK signal. As pointed out above, the MSB of the mid count value of the K-bit count in the phase down-counter 21, as advanced by two HF clock periods, is used to produce the LF LOCAL CLOCK signal. Namely, the rising edge 54-2 of the LF LOCAL CLOCK signal 54 occurs in response to flip-flop 53 being set through OR gate 57, when the DEC MID COUNT+2 circuit 55 detects (55-1) that the contents of the down-counter 21 on link 25 equals the value of the mid count, plus two HF clock cycles. A falling edge (54-1, 54-3) of the LF LOCAL CLOCK signal 54 occurs in response to the flip-flop 53 being reset, when the DEC LO COUNT circuit 51 detects (51-1, 51-2) that the contents of the K-bit down-counter 21 equal the (LO COUNT) value.

As noted earlier, the DLPS 31 compares the LF REF CLOCK signal and the HF clock signal, in order to provide a very precise measure(in terms of a fraction of an HF clock cycle) of the relative timing differential between the LF LOCAL CLOCK signal and the LF REF CLOCK signal. It then generates a LATCH MSPW output pulse 35, which is applied to the CE input of the K-bit latch 41, which loads the current value 42-1 of the K-bit contents of the K-bit phase down-counter 21, as a K-bit MSPW. (It may be noted that when the RESET PHASE input to AND gate 26 is a logical '1' value at the occurrence of the LATCH MSPW pulse 35, the phase of the LF LOCAL CLOCK signal 54 can be reset to match or become aligned (0° relative phase differential) with the LF REF CLOCK signal 32. The output of the AND gate 26 presets the value of the down-counter 21 to the MID COUNT−1.)

Some number (one to $2^L$) of HF clocks subsequent to the rising edge 32-2 of the LF REF CLOCK signal 32, the DLPS 31 outputs a stable L-bit LSPW word on output link 34. This L-bit LSPW word is representative of the relative timing differential between the rising edge of the LF REF CLOCK signal 32 and the next rising edge of the HF clock signal. The DLPS then applies a LATCH PW pulse 36-1 to the CE input of the intermediate K+L bit phase word latch 43, so that the K-bit MSPW 42-1 on link 42 from the K-bit latch 41, and the LSPW 34-1 on link 34 from the DLPS 31 are loaded as a K+L bit phase word 43-1 into the intermediate K+L bit latch 43.

When the DEC LO COUNT circuit 51 detects that the contents of the down-counter 21 match the (LO COUNT) value, so as to produce the falling edge (54-1, 54-3) of the LF LOCAL CLOCK signal 54, it outputs a LATCH OUTPUT PW signal (52-1, 52-2), which is applied over line 52 to the CE port of a K+L bit output phase word latch 45. This causes the K+L bit phase word stored in the intermediate latch 43 to be transferred to the output latch 45. As pointed out above, the K+L output bit phase word latched (45-1, 45-2) in the output latch 45 is a binary representation of the phase position of the rising edge of the LF REF CLOCK signal 32 with respect to the rising edge of the LF LOCAL CLOCK signal 54, where the mid count value (10000 . . . 000) represents phase alignment at zero degrees phase.

Referring now to FIG. 4, the architecture of the DLPS 31, respective components of which are clocked by the HF clock signal, is shown as comprising a multistage digital delay line/shift register 60, which is formed of a cascaded arrangement of flip-flops 61-1, . . . , 61-2L, that are interleaved with selector gates (2:1 multiplexers) 62-1, . . . 62-2$^{L-2}$. As pointed out above, the total number of stages 60-1, . . . ,60-2$^L$ of the delay line/shift register 60 is defined so as to provide an overall effective electronic propagation length or delay through the selector gates equal to or greater than the period of one HF clock signal. The Q output of a respective flip-flop 61-i is coupled to the '1' input of its associated selector gate 62-i. The output of a selector gate 62-i is coupled to the D input of the next flip-flop 61-i+1 and to the '0' input of the next selector gate 62-i+1.

The front end of the delay line/shift register 60 is fed by a multibit input shift register 65 (such as a four bit register, as a non-limiting example). The LF REF CLOCK signal line 32 is coupled to the D input of the shift register 65 and to one input of the AND gate 66. The Q output of the shift register 65 is coupled to an inverting input of AND gate 66. The output of the AND gate 66 is coupled to the D input of the flip-flop 61-1 and to a '0' input port of the first selector gate 62-1.

The Q outputs of the first two flip-flops 61-1 and 61-2 of the delay line/shift register 60 are coupled through an OR gate 67 to produce a shift delay line signal SHIFT DL on line 69. The state of the SHIFT DL signal selects the path through the selector gates 62. It is also coupled to an AND gate 71, an AND gate 73, and to the D input of a flip-flop 81 of a two stage LATCH MSPW pulse generator 80, from which the LATCH MSPW pulse on line 35 is produced. The Q output of the flip-flop 81 of the LATCH MSPW pulse generator 80 is coupled to an input of the OR gate 67, the D input of flip-flop 82, and an input of AND gate 85. The Q output of the flip-flop 82 is coupled to an inverting input of AND gate 85. The output of the AND gate 85 provides the LATCH MSPW signal on line 35.

The output of the selector gate 62-2$^{L-1}$ is coupled through an OR gate 75 to the D input of flip-flop 61-2$^L$ of the $2^L$th or last stage of the delay line/shift register 60. The Q output of flip-flop 61-2$^L$ is coupled to an inverting input of AND gate 73 and to an input of AND gate 71. The output of AND gate 71 is coupled to an input of OR gate 75 and serves as an END SHIFT signal input over line 77 to the D input of a multibit shift register 90. The output of AND gate 73 provides a COUNT signal over line 78 to a CE input of an LSPW up-counter 100, from which the L-bit LSPW output on line 34 is derived.

The length of multibit shift register 90 is selected to delay the rising edge 77-1 of the END SHIFT signal on line 77 by an amount that delays the LATCH PW output pulse by a prescribed interval, such as five HF clock cycles, that ensures that the LATCH MSPW pulse has been generated on line 35 from AND gate 85, and that the MSPW AND LSPW inputs to the K+L latch 43 are stable. This delay also ensures that the output of the first and second flip-flops 61-1 and 61-2 of the delay line 60 are '0', so that just after flip-flop 81 is reset, it does not reclock a '1' back into the flip-flop 81 via OR gate 67. The Q output of shift register 90, which is clocked by the HF clock line 24, is coupled to the D input of a flip-flop 92 and to an input of AND gate 94. The Q output of flip-flop 92, which is also clocked by HF clock line 24, is coupled to an inverting input of AND gate 94. The output of the AND gate 94 is coupled to the RESET input of the LSPW up-counter 100. The contents of the up-counter 100 are coupled through an inverter 102 to the L-bit LSPW link 34 to latch 43.

The operation of the delay line phase sampler (DLPS) architecture of FIG. 4 will now be described with reference to the timing diagrams of FIGS. 5 and 6. As described above, the function of the DLPS is to digitize the phase of the LF REF CLOCK over one cycle of the HF CLOCK signal, as a digital output code (the LSPW) that provides a very precise indication, in terms of a fraction of a single HF clock cycle, of the relative timing differential between the LF LOCAL CLOCK signal and the LF REF CLOCK signal.

Figure 5:
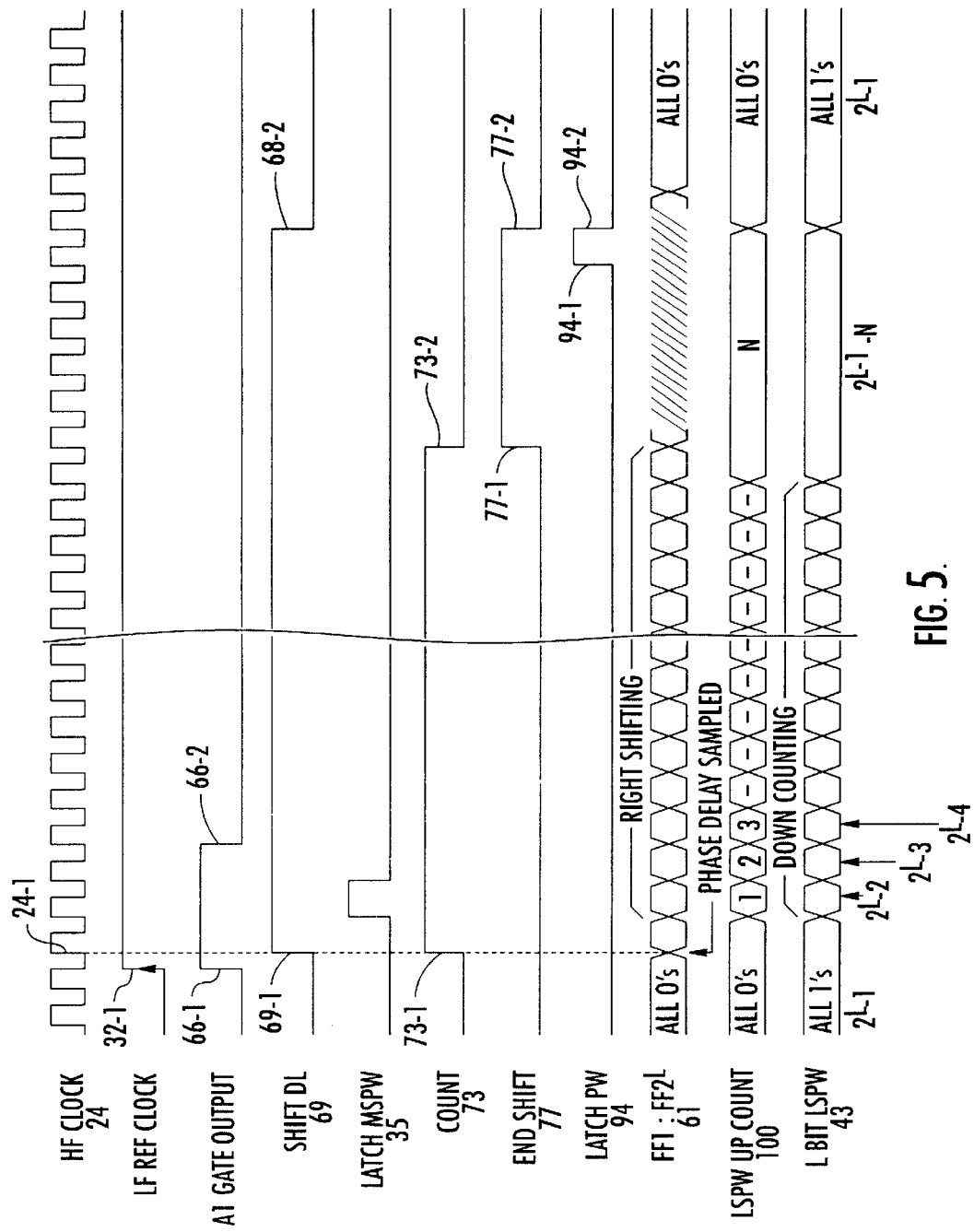
FIGS. 5 and 6 are timing diagrams associated with the operation of the delay line phase sampler of FIG. 4.

As shown at 69-1 in FIG. 5, prior to the rising edge 32-1 of the LF REF CLOCK signal, the SHIFT DL signal 69 is at a logic low level '0'. Also, each of the flip-flops 61 of the delay line/shift register 60, flip-flops 81, 82 and 92, shift registers 65 and 90, as well as up-counter 100 are in a logic '0' state or reset. The path through the selector gates 62 is such as to configure the delay line/shift register as a selector gate delay line that by-passes the flip-flops 61 and allows a bit applied to its input to freely propagate through the selector gates of successive stages of the delay line/shift register 60.

At the rising edge 32-1 of the LF REF CLOCK signal 32 applied to the D input of shift register 65 and the AND gate 66, the output of AND gate 66 goes high at 66-1, as the sampling pulse that goes low at 66-2 after some number of HF CLOCK signals have been applied to the shift register 65. The rising or '1'-going edge 66-1 of the pulse produced by AND gate 66 now simply 'propagates' through successive stages of the delay line 60 and, at the rising edge of the very next HF CLOCK signal 24-1, this propagating '1' will be latched in one of the successive stages 60-1, . . . 60-$2^L$ of the delay line/shift register 60.

Namely, in the left-to-right direction of propagation through successive stages of the delay line/shift register 60, the location of the rightmost '1' position will determine the relative delay between the LF REF CLOCK signal and the HF CLOCK signal. For a zero phase delay, the propagating '1' would be located in the very first stage 60-1, at the rising edge of the next HF clock signal, so that the binary value of the L bit word in the delay line would be 1000 . . . 000. For a one HF clock period phase delay, on the other hand, the propagating '1' would be located farther down the delay line at the rising edge of the next HF clock signal, so that the binary value of the L-bit word in the delay line would be 111111 . . . 00, where the number of '1's corresponds to the number of selector gates employed to replicate one HF CLOCK cycle.

Figure 6:
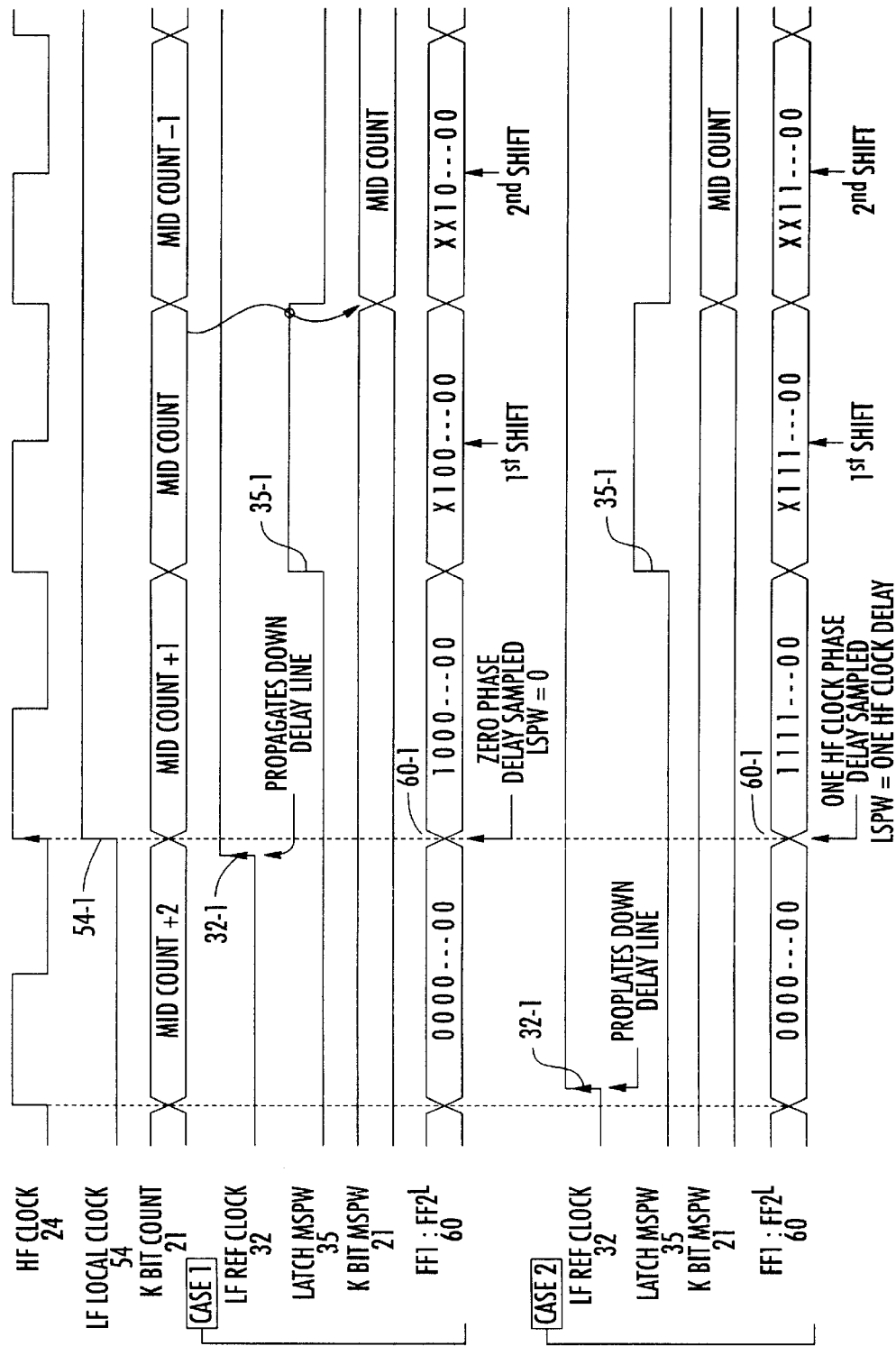

The timing diagram of FIG. 6 shows these two cases of phase delay, one for the zero phase delay (where the rising edge of the next HF CLOCK signal occurs immediately after the rising edge of the LF REF CLOCK signal), and the second for a one HF clock period phase delay (where the rising edge of the next HF CLOCK signal occurs approximately one complete HF CLOCK cycle after the rising edge of the LF REF CLOCK signal), where the K+L phase word ranges from a value of MID COUNT+0 to MID COUNT+ one HF clock period delay LSPW.

In the course of the '1' bit freely propagating through successive stages of the delay line/shift register 60, the state of one of the first two flip-flops 61-1 and 61-2 will be at a logic level '1', when the rising edge of the next HF CLOCK signal occurs, causing the output of OR gate 67 to change the state of the SHIFT DL line 69 to a logic level '1'. This change in the state of the SHIFT DL line 69 at 69-1 (FIG. 5) changes the operational configuration of the delay line/ shift register 60 from a delay line, through which the '1' bit has been propagating, to a shift register, so that its contents may be read out via the LSPW up-counter 100.

To this end, the COUNT output of the AND gate 73 goes high at 73-1 (FIG. 5), so as to enable the LSPW up-counter 100. Once enabled, the contents of the LSPW up-counter 100, which were initially cleared or reset, are sequentially incremented by a binary value of '1' for each HF CLOCK signal applied to its clock port. With the delay line/shift register 60 now operating as a shift register, its contents are successively shifted to the right (from the first stage 60-1 towards the last stage 60-$2^L$) with the rising edge of each successive HF CLOCK signal. Simultaneously, the up-counter 100 is being successively incremented.

On the rising edge of the second HF CLOCK signal after the change in logic state of the SHIFT DL line 69 to a logical '1', the Q output of flip-flop 82 goes high, causing the output of the AND gate 85 on line 35 to produce the LATCH MSPW pulse on output line 35. As described above, the pulse LATCH MSPW is used to load the count value of the down-counter 21 as the K-bit MSPW into the K-bit MSPW latch 41.

As the rightmost '1' bit is clocked through the delay line/shift register 60, it eventually is clocked into the last flip-flop 61-2L, causing the Q output of the flip-flop 61-$2^L$ to go high. This causes the logic state of the COUNT output line from the AND gate 73 to go low at 73-2, to terminate incrementing the contents of LSPW up-counter 100. This also causes the END SHIFT output line 77 from the AND gate 71 to go high at 77-1, which maintains the D input and thereby the Q output of flip-flop 61-2L at a logical '1', until the SHIFT DL line 69 changes state at 69-2. The END SHIFT signal edge 77-1 also changes the state of the D input to shift register 90 from low to high.

After a prescribed number of HF CLOCK signals (e.g., five, as a non-limiting example), the output of the shift register 90 and flip-flop 92 change state, causing the output of the AND gate 94 to reset or clear the up-counter 100. In the meantime, with incrementing of the up-counter 100 terminated by the change in state of the COUNT line at 73-2, the contents of the up-counter 100 now contain a binary value representative of the number of shifts through the delay line/shift register 60 associated with detection of the rightmost '1', which equals the fractional HF cycle phase delay. Through inverters 102, this binary value is converted into the LSPW. Namely, the 'incrementing' of the up-counter has caused the LSPW on line 43 to be 'decremented' from an all '1's value to a value of $2^{L-1}$–N–the value of the LSPW.

One HF CLOCK cycle prior to the output of AND gate 94 clearing the up-counter 100, its output goes high at 94-1 to produce the LATCH PW pulse, that loads the LSPW in up-counter 100 into the L-bit register of the intermediate latch 43. At the next HF CLOCK cycle, the output of AND gate 94 goes low at 94-2, to reset the up-counter 100. The LATCH PW pulse produced by AND gate 94 also resets the flip-flop 81, so that its Q output goes low, changing the state of the SHIFT DL line 69 from a '1' to a '0', as shown at 69-2, and thereby the state of the END SHIFT line 77, as shown at 77-2, so as to prepare the DLPS for the next phase sample.

It should be noted that the present invention is not limited to the above described implementation for generating the LSPW based on the number of '1's in the flip-flops of the delay line/shift register 60. What is key is that there be some mechanism to determine the total number of '1's, minus '1', in the delay line/shift register 60, as latched by the first HF CLOCK signal after the LF REF CLOCK rising edge 32-1.

The embodiment of FIG. 4 has the advantage of using a relatively simple mechanism (an up-counter), which is initially cleared or reset to all '0's.

One non-limiting, alternative mechanism would be to preset an LSPW down-counter to all '1's and then decrement its contents unit the first '1' in the delay line is detected. In this latter approach no bit inversion of the contents of the LSPW counter is required. In both implementations, the length of the delay line/shift register must be exactly $2^L$ stages. Another technique is to simply shift the contents of the delay line/shift register 60 for a total of $2^{L-1}$ times, and count the total number of '1's. This requires two L-bit counters: one to count the number of '1's and another to count when $2^{L-1}$ shifts have occurred. However, this would allow the use of a delay line/shift register of a length not limited to $2^L$. In this case, the number of selector gates can be chosen to provide only the minimum selector gate delay, rather than some multiple of two.

A reduced complexity implementation of the delay line/ shift register employs $2^{L-1}$ selector gates, where L is defined so that there are enough selector gates to provide at least one HF CLOCK signal period delay for the minimum delay selector case. This implies that for a maximum delay selector case, the number of selector gates required to provide a single HF CLOCK period delay may be significantly less (e.g., on the order of only one-fourth as many).

This creates a nonlinear phase mapping of the LSPW with respect to the MSPW. There is a discontinuity in the rollover of the LSPW count to or from a zero count, as the MSPW is incremented or decremented by one count. However, the value of the phase word will always increase or decrease monotonically, as the LF REF CLOCK signal phase is advanced or retarded relative to the LF LOCAL CLOCK signal. In some phase-locked applications, monotonic phase mapping containing discontinuities is acceptable. However, for applications that require improved linearity, periodic calibration can be used to linearize the LSPW values.

Figure 7:
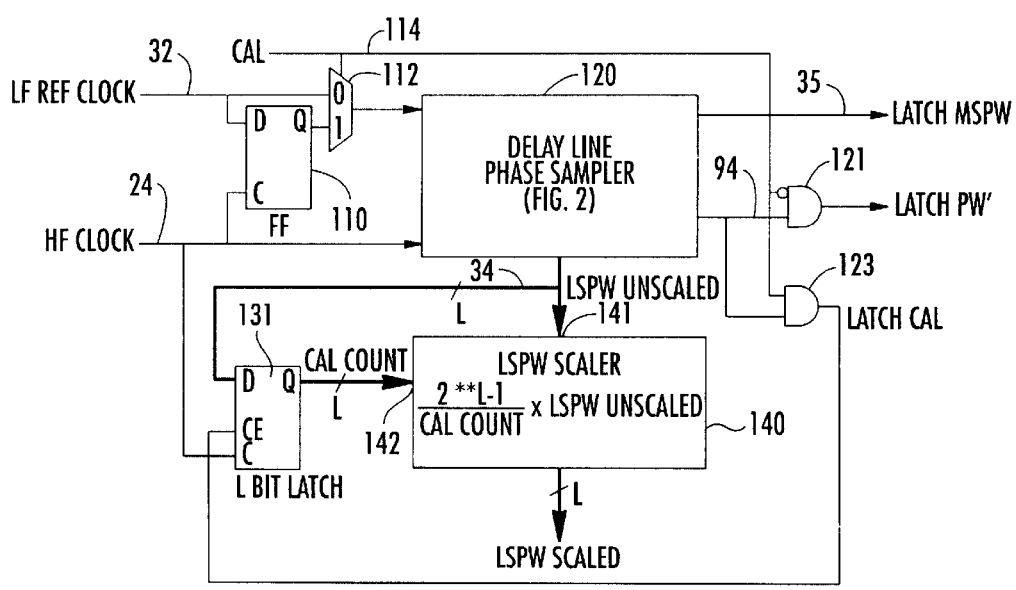
FIG. 7 diagrammatically illustrates a LSPW linearizer circuit.

To this end, FIG. 7 diagrammatically illustrates a LSPW linearizer circuit which is configured to linearize the LSPW output. The LF REF CLOCK signal on line 32 is coupled to the D input of an input flip-flop 110 and to a '0' port of a selector gate 112. The output of selector gate 112 is coupled to the LF REF CLOCK input of a DLPS 120, which is configured of the same DLPS architecture of FIG. 4, described above. The Q output of flip-flop 110 is coupled to the '1' port of the selector gate 112. The steering path through the selector gate 112 is controlled by a CAL count signal line 114, which is further coupled to the inverting input of a LATCH PW AND gate 121 and to LATCH CAL AND gate 123. The input flip-flop 110 and an L-bit latch 131 are clocked by the HF CLOCK signal.

The LATCH MSPW output line 35 from the DLPS 120 is coupled to the CE input of the K-bit latch 41, as described above. The LATCH PW output line 94 from the DLPS 120 is coupled to the other inputs of AND gates 121 and 123. The output of AND gate 121 forms a new gated LATCH PW' pulse that is used to load the LSPW into the L-bit register of the intermediate latch 43. The output of LATCH CAL AND gate 123 is coupled to the CE input of the L-bit latch 131. L-bit latch 131 has its D inputs coupled to receive the 'unscaled' LSPW on link 34, which is further coupled to a first set of input ports 141 of an LSPW scaling circuit or scaler 140. The Q outputs of the L-bit latch 131 are coupled as an L-bit CAL COUNT word to a second set of input ports 142 of the LSPW scaler 140.

The LSPW linearizer of FIG. 7 conducts a periodic calibration to determine one HF CLOCK signal period delay LSPW unscaled count. This count, termed a CAL count, is used to scale or multiply by a scaling factor all LSPW values up to the full $2^{L-1}$ count range. Namely, the LSPW scaler 140, which may be configured as a look-up table, is operative to perform the following multiplication:

LSPW scaled=$2^{L-1}$/CAL COUNT×LSPW UNSCALED.

As a non-limiting example, for the parameter set: L=6, $2^{L-1}$=63, and a one HF CLOCK signal period delay LSPW count=30, a discontinuity jump of 63−30=33 would occur as follows:

0,1,2,3, . . . 29,30 0,1,2,3, . . . 29,30

Ideally, the count sequence should be:

0,1,2,3, . . . 62,63 0,1,2,3, . . . 62,63

If the LSPW is scaled by a factor 63/30, then the value 0 is mapped to 0, 1 is mapped to 2, 24 is mapped to 50, and 30 is mapped to 63. As a consequence, the discontinuity is eliminated and approximately the same resolution of one selector gate delay is maintained.

Calibration is performed by substituting a calibration clock rising edge for a LF REF CLOCK signal rising edge to the DLPS 120 approximately every one to ten seconds, or at periodic intervals, so as to ensure an insignificant delay drift due to integrated circuit temperature and supply voltage variations. During this calibration cycle, the previous value of the LSPW is output and the CAL count value is updated.

Figure 8:
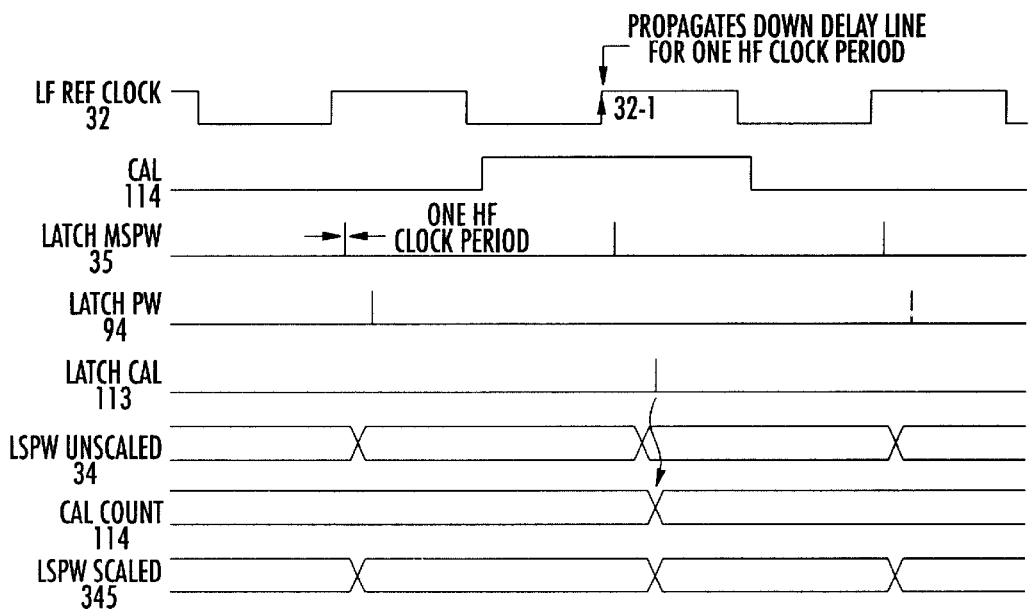
FIG. 8 is a timing diagram associated with the operation of the LSPW linearizer circuit of FIG. 7.

In the timing diagram of FIG. 8, calibration is initiated when the CAL control lead 114 transitions to the logic level of '1', while the LF REF CLOCK is at '0'. The first rising edge of the HF CLOCK on line 24, after the LF REF CLOCK 32 transitions at 32-1 to a '1' logic level, causes the Q output of the input flip-flop 110 to transition to a value of '1', which is coupled to the DLPS 120 by way of the selector gate 112. This results in a '1' propagating through the DLPS' internal delay line/shift register for approximately one HF CLOCK period, before the next HF CLOCK signal transition.

The LATCH PW AND gate 121 maintains the LATCH PW signal at a value of '0' during the calibration period, in order to avoid an erroneous phase word update. The LATCH CAL AND gate 123 outputs the LATCH CAL enable signal to the CE input of the L-bit latch 131, which loads the unscaled LSPW count, to provide the CAL output to the LSPW scaler 140. The value of the CAL count will be slightly less than an ideal value, due to the additional delay through the flip-flop 110. However, this can be compensated by including a correction factor corresponding to the number of selector gate delays that match the D to Q throughput delay of flip-flop 110. This correction factor may be directly added to the CAL count value supplied to the input 142 of the LSPW scaler 140.

It may be noted that if the digital, delay line-based, timing relationship detector is employed in an application where the phase of the LF REF CLOCK signal varies continuously by more than a single period of the HF CLOCK signal, then it is only necessary to periodically detect the maximum value of the LSPW count and latch this maximum value as the CAL count. No calibration cycle, which results in a loss of one LSPW sample, is necessary.

As will be appreciated from the foregoing description, the present invention successfully overcomes shortcomings of conventional phase detection schemes described above by generating a digital code representative of the phase difference between two signals, as a combination of a first, most significant phase word (or MSPW), and a second, least significant phase word (or LSPW). Advantageously, the digital code is very high resolution with each increment based on the delay of a digital gate.

While I have shown and described several embodiments in accordance with the present invention, it is to be understood that the same is not limited thereto but is susceptible to numerous changes and modifications as known to a person skilled in the art, and I therefore do not wish to be limited to the details shown and described herein, but intend to cover all such changes and modifications as are obvious to one of ordinary skill in the art.

What is claimed is:

1. An apparatus for generating a digital output code representative of a timing relationship between first and second events comprising:
    a first digital code generator that generates a first digital code, which changes in accordance with a high frequency clock signal supplied thereto from a first value associated with the occurrence of said first event to a second value associated with the occurrence of said second event; and
    a second digital code generator that generates a second digital code, which changes from a third value associated with the occurrence of a transition in said high frequency clock to a fourth value associated with the occurrence of a transition in said high frequency clock signal; and a digital code combiner, which is coupled to said first and second digital code generators and is operative to generate said digital output code in accordance with said second value of said first digital code and said fourth value of said second digital code.

2. An apparatus according to claim 1, wherein said first event corresponds to a transition in a first signal, and said second event corresponds to a transition in a second signal, and wherein said timing relationship is representative of phase difference between said first and second signals.

3. An apparatus according to claim 1, wherein said second digital code generator comprises a multistage digital delay line, which is configured to propagate therethrough a digital value associated with the occurrence of said second event until the occurrence of said transition in said high frequency clock signal, and wherein said fourth value of said second digital code is representative of the number of stages of said multistage digital delay line through which said digital value has propagated, upon the occurrence of said transition in said high frequency clock signal.

4. An apparatus according to claim 3, wherein said second digital code generator further includes a counter, the contents of which are changed from a first count value to a second count value in accordance with said number of stages of said multistage digital delay line through which said digital value has propagated at the occurrence of said transition in said high frequency clock signal, and wherein said fourth value is defined in accordance with said second count value.

5. An apparatus according to claim 4, wherein said multistage digital delay line is configured to have the contents thereof shifted by a clock signal for clocking said counter in association with said number of stages of said multistage digital delay line through which said digital value has propagated at the occurrence of said transition in said high frequency clock signal.

6. An apparatus according to claim 2, wherein said first digital code generator contains a K-bit counter, contents of which are changed by said high frequency clock signal, and wherein successive transitions in said first signal are generated in association with prescribed values of contents of said K-bit counter, and wherein said digital code combiner is operative to have contents of said K-bit counter coupled thereto as a most significant K-bit portion of said digital output code, in response to said transition in said second signal.

7. An apparatus according to claim 6, wherein said second digital code generator comprises a multistage digital delay line/shift register, which is configurable as a delay line for the propagation therethrough of a digital value associated with the occurrence of said transition in said second signal until the occurrence of said transition in said high frequency clock signal, and wherein said digital code combiner is operative to have L-bit contents of said multistage digital delay line/shift register coupled thereto as a least significant L-bit portion of said digital output code, in accordance with the time of occurrence of said transition in said high frequency clock signal relative to said transition in said second signal.

8. An apparatus according to claim 7, wherein said second digital code generator further includes a counter, the contents of which are changed from a first count value to a second count value in accordance with said number of stages of said multistage digital delay line/shift register through which said digital value has propagated at the occurrence of said transition in said high frequency clock signal subsequent to said transition in said second signal, and wherein said least significant L-bit portion of said digital output code is defined in accordance with said second count value.

9. An apparatus according to claim 8, wherein said multistage digital delay line/shift register has an effective electronic propagation length equal to or greater than one high frequency clock cycle.

10. An apparatus according to claim 7, wherein said multistage delay line/shift register comprises a plurality of delay stages greater than that of a single high frequency cycle, and wherein said second digital code generator further includes a scaling circuit for compensating for nonlinear phase mapping of said least significant L-bit portion of said digital output code relative to said most significant K-bit portion of said digital output code.

11. An apparatus according to claim 10, wherein said scaling circuit is operative to conduct a periodic calibration for scaling said least significant L-bit portion of said digital output code.

12. An apparatus for generating a K+L bit digital output code representative of a timing relationship between first and second signals, as a combination of a K-bit most significant phase word and an L-bit least significant phase word, comprising a first digital code generator which is operative to generate said K-bit most significant phase word in accordance with the number of high frequency clock signals counted between transitions in said first and second signals, and a second digital code generator which is operative to generate said L-bit least significant phase word based upon the effective length through a delay line propagated by a digital value associated with a transition in said second signal, until a transition of the next occurring high frequency clock signal.

13. An apparatus according to claim 12, wherein said delay line comprises a multistage digital delay line/shift register, which is configurable as a delay line for the propagation therethrough of said digital value associated with the occurrence of said transition in said second signal until the occurrence of said transition in said high frequency clock signal, and wherein said multistage digital delay line/shift register is configurable as a shift register through which said digital value associated with said transition in said second signal is clocked in response to said occurrence in said high frequency clock signal, and wherein said second digital generator is operative to generate said L-bit, least significant phase word in accordance with a count associated with the number of stages of said multistage digital delay line/shift register through which said digital value is shifted.

14. An apparatus according to claim 13, wherein said multistage digital delay line/shift register has an effective electronic propagation length equal to or greater than one high frequency clock cycle.

15. An apparatus according to claim 12, wherein said multistage delay line/shift register comprises a plurality of delay stages greater than that of a single high frequency cycle, and wherein said second digital code generator further includes a scaling circuit for compensating for nonlinear phase mapping of said least significant L-bit portion of said digital output code relative to said most significant K-bit portion of said digital output code.

16. An apparatus according to claim 12, wherein said first digital code generator contains a K-bit counter, contents of which are changed by said high frequency clock signal, and is operative to generate said most significant K-bit portion of said digital output code as contents of said K-bit counter coupled thereto in response to said transition in said second signal.

17. A method for generating a K+L bit digital output code as representative of a phase relationship between first and second clock signals, comprising the steps of:

(a) generating a K-bit most significant phase word in accordance with a count of high frequency clock signals between transitions of said first and second clock signals;

(b) propagating a digital value associated with a transition in said second clock signal through a delay line until a transition of the next occurring high frequency clock signal, and generating an L-bit least significant phase word based upon the effective delay through said delay line propagated by said digital value; and (c) (c) combining said K-bit most significant phase word and said L-bit least significant phase word to derive said K+L bit digital output code.

18. A method according to claim 17, wherein said delay line comprises a multistage digital delay line/shift register, which is configurable as a delay line for the propagation therethrough in step (b) of said digital value associated with the occurrence of said transition in said second signal until the occurrence of said transition in said high frequency clock signal, and wherein said multistage digital delay line/shift register is configurable as a shift register through which said digital value associated with said transition in said second signal is clocked in step (b) in response to said occurrence in said high frequency clock signal, and wherein said second digital generator is operative to generate said L-bit, least significant phase word in accordance with a count associated with the number of stages of said multistage digital delay line/shift register through which said digital value is shifted.

19. A method according to claim 18, wherein said multistage digital delay line/shift register has an effective electronic propagation length equal to or greater than one high frequency clock cycle.

20. A method according to claim 18, wherein said multistage delay line/shift register comprises a plurality of delay stages greater than that of a single high frequency cycle, and wherein step (b) further includes compensating for nonlinear phase mapping of said L-bit least significant phase word relative to said K-bit most significant K-bit phase word.

* * * * *